(12) United States Patent
Tsuruma et al.

(10) Patent No.: US 6,338,924 B1
(45) Date of Patent: Jan. 15, 2002

(54) PHOTOMASK FOR NEAR-FIELD EXPOSURE HAVING OPENING FILLED WITH TRANSPARENT MATERIAL

(75) Inventors: Isao Tsuruma; Masayuki Naya, both of Kaisei-machi (JP)

(73) Assignee: Fuji Photo Film Co., Ltd., Kangawa (JP)

(*) Notice: Subject to any disclaimer, the term of this patent is extended or adjusted under 35 U.S.C. 154(b) by 0 days.

(21) Appl. No.: 09/598,452

(22) Filed: Jun. 22, 2000

(30) Foreign Application Priority Data

Jun. 22, 1999 (JP) .............................. 11-175630
Jun. 22, 1999 (JP) .............................. 11-175631
Sep. 27, 1999 (JP) .............................. 11-272045

(51) Int. Cl.$^7$ ................................................ G03F 9/00
(52) U.S. Cl. ................................................ 430/5
(58) Field of Search .................... 430/5, 321, 322, 430/296; 378/35; 716/19, 21

(56) References Cited

U.S. PATENT DOCUMENTS 5,928,815 A * 7/1999 Martin ........................ 430/5

* cited by examiner

Primary Examiner—S. Rosasco
(74) Attorney, Agent, or Firm—Sughrue Mion, PLLC

(57) ABSTRACT

A photomask for use in near-field exposure includes a mask support which is transparent to exposure light; a shading film which is formed on one side of the mask support, and has at least one-opening arranged to form a predetermined pattern; and at least one filler which is transparent to the exposure light, and is arranged in the at least one opening with a predetermined height above the level of the boundary between the mask support and the shading film. The difference between the thickness of the shading film and the height of each of the at least one filler does not exceed 50 nanometers.

25 Claims, 9 Drawing Sheets

DIRECTION OF
INCIDENT LIGHT
FOR EXPOSURE

DIRECTION OF INCIDENT LIGHT FOR EXPOSURE

DIRECTION OF INCIDENT LIGHT FOR EXPOSURE

PRIOR ART

DIRECTION OF
INCIDENT LIGHT
FOR EXPOSURE

PHOTOMASK FOR NEAR-FIELD EXPOSURE HAVING OPENING FILLED WITH TRANSPARENT MATERIAL

BACKGROUND OF THE INVENTION

1. Field of the Invention

The present invention relates to a photomask used in a near-field exposure system for micropattern transfer. The present invention also relates to a process for producing the photomask.

2. Description of the Related Art

Since packing densities of semiconductor chips are increasing, higher resolution is required in photolithography. In response to the requirement for high resolution, exposure wavelengths have been shortened, and illumination techniques have been improved. However, when line widths in the order of 0.1 micrometers or below are required, further improvement is needed.

In the above situations, conventionally, techniques of exposure with X-rays having shorter wavelengths or electron beams are proposed. However, those techniques have drawbacks of high equipment cost and low throughput.

For example, in distributed Bragg reflector (DBR) or distributed feedback (DFB) semiconductor laser devices, gratings are formed inside the semiconductor laser devices. In such semiconductor laser devices, sometimes grating patterns having line widths in the order of 0.1 micrometers or below are required. Generally, the gratings may be realized by high-order gratings. In the case of the high-order gratings, it is easy to form a grating because the grating pitch becomes large. However, in the high-order grating, an amount of fed-back light is reduced due to spatial diffraction light, and it is necessary to control the line-and-space ratio with high accuracy. Therefore, it is preferable to realize the gratings by first-order gratings. In the case of the first-order gratings, the required dimensions of the grating patterns are in the order of 0.1 micrometers or below. Currently, the grating patterns are formed by directly writing the grating patterns with electron beams. However, according to the conventional techniques, expensive equipment is needed, and throughput is low.

Recently, the so-called near-field exposure technology is receiving attention. The near-field exposure enables transfer of micropatterns which are finer than the diffraction limit. In the near-field exposure technique, a photomask having openings which are smaller than the wavelength of exposure light is used to expose an object such as a photoresist layer to near-field light emerging from the openings of the photomask. Since the depth and extent to which the near-field light substantially propagates are smaller than the wavelength of exposure light, the near-field light enables transfer of a micropattern having dimensions smaller than the wavelength of exposure light, to the object which is to be exposed. Due to the small depth of propagation of the near-field light, the so-called contact exposure method is used.

Conventionally, the photomasks used in the contact exposure method are produced as follows.

A shading film is formed on a surface of a mask support made of a material such as glass, which is transparent to exposure light. In the shading film, an antireflection film is added to a metal film such as a chromium film. Then, the shading film is coated with a photoresist. Next, a resist pattern with openings having smaller widths than wavelength of exposure light is formed by electron beam exposure or the like. Finally, the shading film is etched by using the resist pattern as a mask so as to produce mask openings.

Alternatively, the photomasks used in the contact exposure method may be produced as explained below with reference to FIGS. 10A to 10D.

Figure 10A:
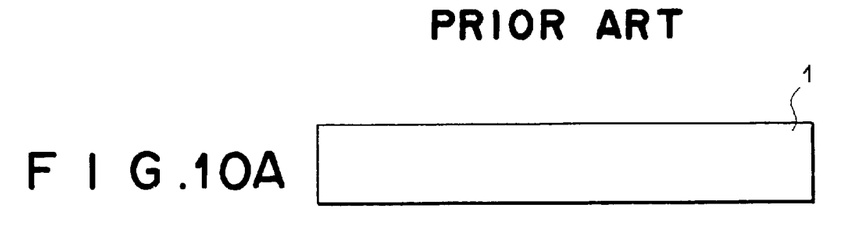
FIGS. 10A to 10D are cross-sectional views illustrating a process of producing a conventional photomask.
Figure 10B:
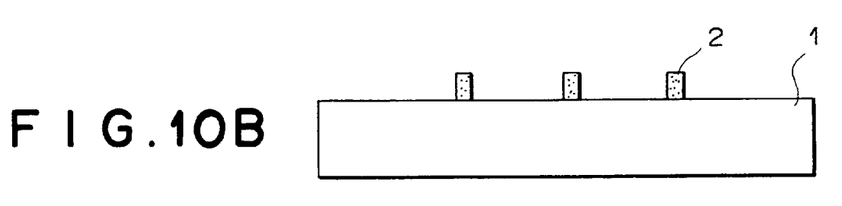
Figure 10C:
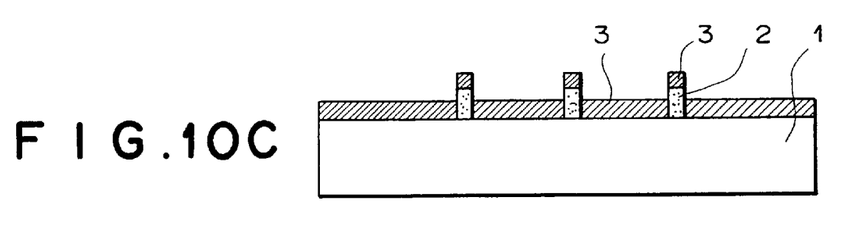
Figure 10D:
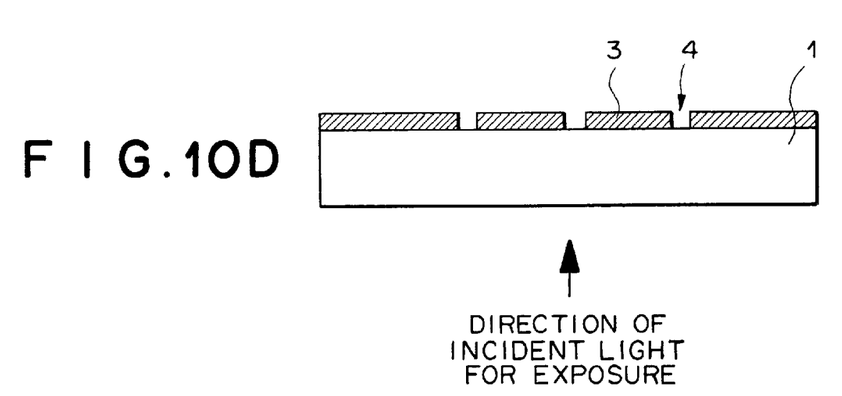

A mask support 1 made of glass or the like is provided as illustrated in FIG. 10A. Then, the surface of the mask support 1 is coated with photoresist, and a resist pattern 2 is formed by electron beam exposure or the like, as illustrated in FIG. 10B, where the line widths of the resist pattern 2 are smaller than the wavelength of the exposure light. Next, a shading film 3 is formed by sputter deposition of chromium, using the resist pattern 2 as a mask, as illustrated in FIG. 10C. Finally, the resist pattern 2 is removed so as to produce mask openings 4 at the positions from which the resist pattern 2 is removed, as illustrated in FIG. 10D.

In the conventional photomasks produced as above, a shading film is deposited on a planner surface of a mask support, and the shading film has openings which are arranged to form a predetermined pattern. In the case where such photomasks are used in the near-field exposure, exposure light is applied through the photomask to an object such as a photoresist layer, from the opposite side to the above surface on which the shading film is formed, so that near-field light emerges through the above openings of the shading film, and the object is exposed with the near-field light when the object is placed in contact with or in proximity to the shading film.

Nevertheless, since in the conventional photomasks having the above construction, the near-field light propagates to only a small distance from the mask support, it is impossible to sufficiently thicken the shading film. Therefore, the following problems arise.

The depth to which the emerged near-field light propagates, i.e., the distance to which the near-field light propagates from the surface of the mask support in the photomask having the above construction, is at most tens of nanometers. Therefore, unless the thickness of the shading film is at most tens of nanometers, the near-field light cannot reach the object which is to be exposed, even when the object is placed in contact with or in proximity to the shading film.

However, when the thickness of the shading film is sufficiently thin, i.e., at most tens of nanometers, the shading film is prone to suffer defects such as pinholes. In addition, transmittance of light through the shading film increases with decrease in the thickness of the shading film. Therefore, when the shading film is thinned, the extinction ratio, i.e., the ratio of the amount of light transmitting through the shading film and the amount of light transmitting through the openings of the shading film becomes small, and fogging may occur in the case where the exposed object is highly sensitive.

Further, in the case of contact exposure, the shading film may be damaged by the contact with the object which is to be exposed, for example, during the operation of aligning the photomask with the object. That is, the durability of the photomask is insufficient.

However, if the above shading film is thickened to exceed tens of nanometers, the near-field light cannot reach the object to be exposed at all. Even when the thickness of the shading film is tens of nanometers, the near-field light is greatly attenuated so that the photoresist cannot receive a sufficient amount of exposure light. Thus, the upper limit of the thickness of the shading film is estimated to be 50 nm.

In addition, when the aforementioned grating pattern is produced by using the conventional photomasks and directly writing a micropattern with an electron beam, only a small margin is allowed for control of the line-and-space ratio, and the production cost becomes high.

SUMMARY OF THE INVENTION

An object of the present invention is to provide a photomask which enables exposure of an object such as a photoresist layer to near-field light with a sufficient intensity, and allows formation of a sufficiently thick shading film having high durability and preventing fogging.

Another object of the present invention is to provide a process for producing a photomask which enables exposure of an object such as a photoresist layer to near-field light with a sufficient intensity, and allows formation of a sufficiently thick shading film having high durability and preventing fogging.

Still another object of the present invention is to provide a photomask which can be used in production of a grating pattern, allows a great margin for control of a line-and-space ratio of the grating pattern during the production of the photomask, and can be produced at a low cost.

A further object of the present invention is to provide a process for producing a photomask which can be used in production of a grating pattern, allows a great margin for control of a line-and-space ratio of the grating pattern during the production of the photomask, and enables production of the grating pattern at a low cost.

(1) According to the first aspect of the present invention, there is provided a photomask for use in near-field exposure, comprising: a mask support which is transparent to exposure light; a shading film which is formed on one side of the mask support, and has at least one opening arranged to form a predetermined pattern; and at least one filler which is transparent to the exposure light, and is arranged in the at least one opening with a predetermined height above the level of the boundary between the mask support and the shading film.

The photomask according to the first aspect of the present invention may also have one or any possible combination of the following additional features (i) to (iii).

(i) The difference between the thickness of the shading film and the height of each of the at least one filler may be determined so as not to exceed 50 nanometers.

(ii) Each of the at least one filler may have a shape which is gradually narrowed toward the top of the filler.

(iii) Each of the at least one filler may be made of a different material from the mask support, and is coupled to the mask support.

(2) According to the second aspect of the present invention, there is provided a process for producing a photomask for use in near-field exposure, comprising the steps of: (a) forming, on one side of a flat mask support which is transparent to exposure light, a shading film having at least one opening arranged to form a predetermined pattern; and (b) forming at least one filler which is transparent to the exposure light, in the at least one opening with a predetermined height above the level of the boundary between the mask support and the shading film.

The photomask according to the first aspect of the present invention can be produced by the process according to the second aspect of the present invention.

The process according to the second aspect of the present invention may also have one or any possible combination of the following additional features (iv) to (vi).

(iv) The at least one filler may be formed by embedding, in the at least one opening, a different material from the mask support.

(v) The process according to the second aspect of the present invention may further comprise the step (c) of planarizing one side of the mask support, after the shading film and the filler are formed on the mask support in the steps (a) and (b), by a polishing operation, so that the difference between the thickness of the shading film and the height of each of the at least one filler does not exceed 50 nanometers.

(vi) The process according to the second aspect of the present invention may further comprise the step (c') of planarizing one side of the mask support, after the shading film and the filler are formed on the mask support in the steps (a) and (b), by an etching-back operation, so that the difference between the thickness of the shading film and the height of each of the at least one fillers does not exceed 50 nanometers.

(3) According to the third aspect of the present invention, there is provided a photomask for use in near-field exposure, comprising: a mask support which is transparent to exposure light; and a shading film which is formed on one side of the mask support, and has at least one opening arranged to form a predetermined pattern. The mask support comprises at least one protrusion so as to fill the at least one opening, and have a predetermined height above the level of the bottom of the shading film.

The photomask according to the third aspect of the present invention may also have one or any possible combination of the following additional features (vii) and (viii).

(vii) The difference between the thickness of the shading film and the height of each of the at least one protrusion may be determined not to exceed 50 nanometers.

(viii) Each of the at least one protrusion may have a shape which is gradually narrowed toward the top of the protrusion.

(4) According to the fourth aspect of the present invention, there is provided a process for producing a photomask for use in near-field exposure, comprising the steps of: (a) etching a surface, other than at least one portion corresponding to at least one opening of a shading film, of a flat mask support which is transparent to exposure light, to a predetermined depth, so as to form at least one concave portion, and leave at least one protrusion corresponding to the at least one opening, where the at least one protrusion has at least a predetermined height above the level of the bottom of the at least one concave portion; and (b) forming the shading film in the at least one concave portion.

The photomask according to the third aspect of the present invention can be produced by the process according to the fourth aspect of the present invention.

The process according to the fourth aspect of the present invention may also have one or any possible combination of the following additional features (ix) and (x).

(ix) The process according to the fourth aspect of the present invention may further comprise the step (c) of planarizing one side of the mask support, after the shading film is formed on the mask support in the step (b), by a polishing operation, so that the difference between the thickness of the shading film and the height of each of the at least one protrusion does not exceed 50 nanometers.

(x) The process according to the fourth aspect of the present invention may further comprise the step (c') of planarizing one side of the mask support, after the shading film is formed on the mask support in the step (b), by an etching-back operation, so that the difference between the thickness of the shading film and the height of each of the at least one protrusions does not exceed 50 nanometers.

(5) According to the fifth aspect of the present invention, there is provided a photomask for use in near-field exposure, comprising: a mask support which is transparent to exposure light, and has a plurality of concave portions on one side of the mask support so as to form at least one convex portion between the plurality of concave portions; and a shading film which is embedded in the plurality of concave portions, and has at least one opening arranged to form a predetermined pattern, where the at least one convex portion corresponds to the at least one opening. In the photomask, the difference between heights of the top surfaces of the at least one convex portion and the shading film does not exceed 50 nanometers.

The photomask according to the fifth aspect of the present invention may also have the following additional feature (xi).

(xi) Each of the at least one convex portion may have a shape which is gradually narrowed toward the top surface of the convex portion.

(6) According to the sixth aspect of the present invention, there is provided a process for producing a photomask for use in near-field exposure, comprising the steps of: (a) producing a mold having a plurality of first convex portions and at least one first concave portion, where the plurality of first convex portions are provided for forming a plurality of second concave portions on one side of a mask support, and the at least one first concave portion is provided for forming at least one second convex portion on the side of the mask support; (b) forming the mask support by using the mold, where the mask support is transparent to exposure light, and has the plurality of second concave portions on the side of the mask support and the at least one second convex portion between the plurality of second concave portions; (c) depositing a shading material on an entire area of the mask support so as to fill the plurality of second concave portions with the shading material, and form a layer of the shading material; and (d) removing a portion of the layer of the shading material by performing a planarizing operation on the layer of the shading material so as to expose at least a top surface of each of the at least one second convex portion, and form a shading film with a remaining portion of the layer of the shading material.

The photomask according to the fifth aspect of the present invention can be produced by the process according to the sixth aspect of the present invention.

The process according to the sixth aspect of the present invention may also have one or any possible combination of the following additional features (xii) to (xv).

(xii) In the step (a), the mold may be made of silicon, and formed by anisotropic etching.

(xiii) In the step (a), the at least one first concave portion may have a shape which is narrowed toward a top of each of the at least one first concave portion.

(xiv) In the step (d), the planarizing operation may be realized by a polishing operation.

(xv) In the step (d), the planarizing operation may be realized by an etching-back operation.

(7) The advantages of the photomasks according to the first and third aspects of the present invention are explained below.

In the photomask according to the first or third aspect of the present invention, a filler or protrusion of the mask support is arranged in each opening of the shading film, and the filler or protrusion has a predetermined height above the level of the boundary between the mask support and the shading film. That is, even when the thickness of the shading film is increased, the filler or protrusion can be formed to have a sufficient height so that near-field light emerging from the surface of the filler or protrusion can reach an object which is to be exposed, immediately or within a very short distance, i.e., before the near-field light is greatly attenuated. Thus, it is possible to sufficiently increase the thickness of the shading film so as to secure a sufficient extinction ratio, prevent the aforementioned fogging, and enhance the durability of the shading film.

The top surface of the filler or protrusion and the top surface of the shading film may be located at the same distance from the object, or the top surface of the filler or protrusion may be located nearer to or farther from the object, than the top surface of the shading film. In particular, it is preferable that there is a relationship between the thickness d of the shading film and the height h of the filler or protrusion as follows.

$$h-50(nm) \leq d \leq h+50(nm)$$

That is, the difference between the thickness d of the shading film and the height h of each of the at least one filler may be determined so as not to exceed 50 nanometers.

The advantages of the photomasks according to the first and third aspects of the present invention are explained for the three cases of h=d, h<d, and h>d.

(a) First, the advantages in the case where the top surface of the shading film is flush with the top surface of the filler or protrusion, i.e., h=d, are explained below.

In this case, when the photomask is placed so that the shading film is in contact with an object such as a photoresist layer for near-field exposure, the top surface of the filler or protrusion is also in contact with the object. Therefore, near-field light emerged from the top surface of the filler or protrusion can enter the object immediately. Thus, the object can be exposed to the near-field light with a sufficient intensity.

When the photomask is placed at a small distance, not exceeding 50 nanometers, from an object such as a photoresist layer during near-field exposure, the propagation distance of the near-field light from the top surface of the filler or protrusion to the object does not exceed 50 nanometers. Therefore, the near-field light emerging from the top surface of the filler or protrusion can reach the object before the near-field light is greatly attenuated. Therefore, the object can also be exposed to the near-field light with a sufficient intensity.

In addition, the thickness d of the shading film can be increased to a necessary amount, as far as the height h of the filler or protrusion above the level of the boundary between the mask support and the shading film can be increased with the thickness d of the shading film. That is, the thickness of the shading film can be increased sufficiently so as to secure a sufficient extinction ratio, prevent the aforementioned fogging, and enhance the durability of the shading film.

(b) Next, the advantages in the case where the height h of the filler or protrusion is smaller than the thickness d of the shading film, i.e., h<d≦h+50(nm), are explained below.

In this case, when the photomask is placed so that the shading film is in contact with an object such as a photoresist layer for near-field exposure, the top surface of the filler or protrusion is at a very short distance from the object. Therefore, near-field light emerging from the top surface of the filler or protrusion can reach the object before the near-field light is greatly attenuated. Therefore, the object can also be exposed to the near-field light with a sufficient intensity.

When the difference between the height h of the filler or protrusion and the thickness d of the shading film is very small, and during near-field exposure the shading film is located at such a short distance from the object that the propagation distance of the near-field light from the top surface of the filler or protrusion to the object does not exceed 50 nanometers, and the near-field light emerging from the top surface of the filler or protrusion can reach the object before the near-field light is greatly attenuated. Therefore, the object can also be exposed to the near-field light with a sufficient intensity.

In addition, the thickness d of the shading film can be increased to a necessary amount, as far as the height h of the filler or protrusion above the level of the boundary between the mask support and the shading film can be increased so that the difference between the height h of the filler or protrusion and the thickness d of the shading film does not exceed 50 nanometers. Therefore, the thickness of the shading film can be increased sufficiently so as to secure a sufficient extinction ratio, prevent the aforementioned fogging, and enhance the durability of the shading film.

(c) The advantages in the case where the height h of the filler or protrusion is greater than the thickness d of the shading film, i.e., $h-50(nm) \leq d < h$, are explained below.

In this case, when the photomask is placed in contact with an object such as a photoresist layer for near-field exposure, the top surface of the filler or protrusion is in contact with the object. Therefore, near-field light emerging from the top surface of the filler or protrusion can immediately enter the object. Therefore, the object can also be exposed to the near-field light with a sufficient intensity.

Even when the photomask is placed at a short distance from an object such as a photoresist layer during near-field exposure, the near-field light emerged from the top surface of the filler or protrusion can reach the object before the near-field light is greatly attenuated, as far as the propagation distance of the near-field light from the top surface of the filler or protrusion to the object does not exceed 50 nanometers. Therefore, the object can also be exposed to the near-field light with a sufficient intensity.

In addition, the thickness d of the shading film can be increased to a necessary amount, as far as the height h of the filler or protrusion above the level of the boundary between the mask support and the shading film can be increased with the thickness d of the shading film. That is, the thickness of the shading film can be increased sufficiently so as to secure a sufficient extinction ratio, prevent the aforementioned fogging, and enhance the durability of the shading film.

Further, the height h of the filler or protrusion is limited so that the difference between the height h of the filler or protrusion and the thickness d of the shading film does not exceed 50 nanometers. This is because the resolution of an image generated by exposure may be lowered due to spread of the near-field light when the height h of the filler or protrusion exceeds the thickness d of the shading film by too much.

(8) The advantages of the photomask according to the fifth aspect of the present invention and the process for producing a photomask according to the sixth aspect of the present invention are explained below.

In the photomask according to the fifth aspect of the present invention, the mask support has at least one convex portion and a plurality of concave portions, a shading film is embedded in the plurality of concave portions, and the difference between heights of the top surfaces of the at least one convex portion and the shading film does not exceed 50 nanometers. The top surfaces of the at least one convex portion and the shading film may be located at the same distance from the object.

Alternatively, the at least one top surface of the at least one convex portion may be located nearer to or farther from the object, than the top surface of the shading film. The relationship between the thickness d of the shading film and the height h of the filler or protrusion can be expressed as follows.

$$h-50(nm) \leq d \leq h+50(nm)$$

Since the shading film is embedded in the plurality of concave portions of the mask support, the thickness of the shading film can be increased to a necessary amount by increasing the depth of the plurality of concave portions of the mask support. Therefore, the thickness of the shading film can be increased sufficiently so as to secure a sufficient extinction ratio, prevent the aforementioned fogging, and enhance the durability of the shading film.

When each of the at least one convex portions has a shape which is gradually narrowed toward the top surface of the convex portion, the attenuation of the exposure light during the propagation through each convex portion can be reduced. Therefore, the object can be efficiently exposed to the near-field light.

Next, the advantages of the process for producing a photomask according to the sixth aspect of the present invention are explained below.

The mask support including the at least one second convex portion and the plurality of second concave portions can be produced by using a mold having the plurality of first convex portions and the at least one second concave portion. Therefore, once a mold is produced, a number of identical mask supports can be produced easily. Thereafter, a number of photomasks can be produced by operations such as evaporation, polishing, etching, and the like, which can be performed on a plurality of mask supports by batch processing.

In particular, when a mold is produced from a silicon wafer, and the convex and concave portions are formed by anisotropic etching, accurate processing is possible.

When each of the at least one first concave portions of the mold has a shape which is gradually narrowed toward the bottom thereof, each of the at least one second convex portions of the mask support has a shape which is gradually narrowed toward the top surface of the convex portion. Therefore, the width of the top surface of each of the at least one convex portions of the mask support can be accurately adjusted by controlling the amount of the shading material removed by the planarization processing, e.g., by controlling the etched depth when the planarization is realized by etching.

The width of the top surface of each of the at least one convex portions of the mask support is the width of each opening of the shading film. Therefore, when a grating pattern is produced by near-field exposure using a photomask produced by the process according to the sixth aspect of the present invention, the line-and-space ratio of the grating pattern can be accurately adjusted by controlling the amount of the shading material removed by the planarization processing. Namely, even when the mold is produced with a relatively large margin, a desired line-and-space ratio of the grating pattern can be obtained by appropriately controlling the amount (depth) of the removed shading material. When large margins are allowed for the dimensions of the convex and concave portions of the mold, the mold can be manufactured in a short time at low cost. Therefore, the photomask produced by the process according to the sixth aspect of the present invention can be manufactured in a short time at low cost.

DESCRIPTION OF PREFERRED EMBODIMENTS

Embodiments of the present invention are explained in detail below with reference to drawings.

First Embodiment

The process for producing a photomask for use in near-field exposure, as the first embodiment of the present invention, is explained below with reference to FIGS. 1A to 1F, which are cross-sectional views of the constructions in the initial, four intermediate, and final stages of the process.

Figure 1A:
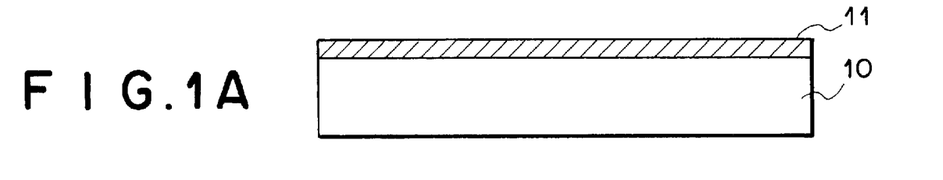
FIGS. 1A to 1F are cross-sectional views of the constructions in the initial, four intermediate, and final stages in the process of producing a photomask in the first embodiment of the present invention.

In the first stage, a shading film 11 is formed on a surface of a mask support 10, as illustrated in FIG. 1A. The mask support 10 is made of a flat quartz glass plate. For example, the shading film 11 is made of a chromium film having a thickness of 50 nm and a chromium oxide film having a thickness of 50 nm.

Figure 1B:
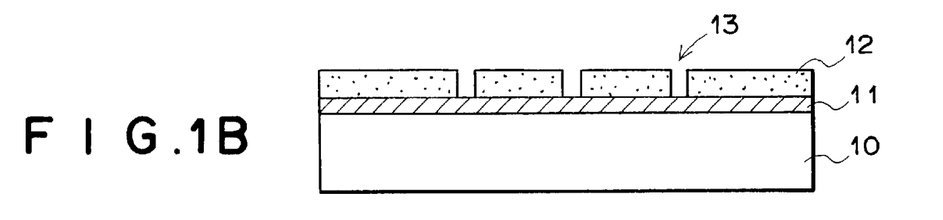

In the second stage, first, the shading film 11 is coated with an electron beam resist, which is then baked. Next, portions of the electron beam resist, corresponding to a predetermined pattern, are exposed to an electron beam, and post exposure baking (PEB) is performed. Thereafter, a developing operation is performed on the electron beam resist by using a special developer, so that a resist pattern 12 with openings 13 having desired shapes and widths of 0.01 to 0.1 micrometers is formed as illustrated in FIG. 1B.

Figure 1C:
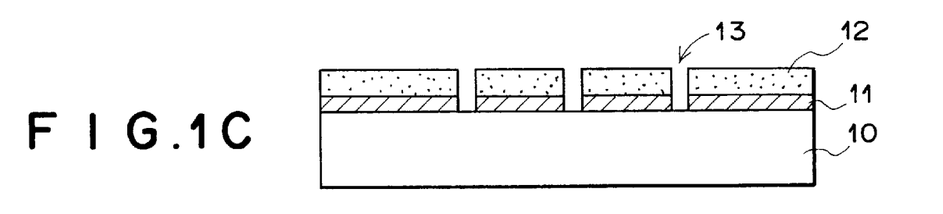

In the third stage, the shading film 11 is removed, as illustrated in FIG. 1C, by a dry etching process using $CCl_4+O_2$ as etching gas, and the above resist pattern 12 as a mask.

In the fourth stage, the resist pattern 12 is removed by using a special remover solution, and then the remover solution is rinsed off. Thus, the openings 11a are formed in the shading film 11 so as to form a desired pattern, as illustrated in FIG. 1D.

Figure 1D:
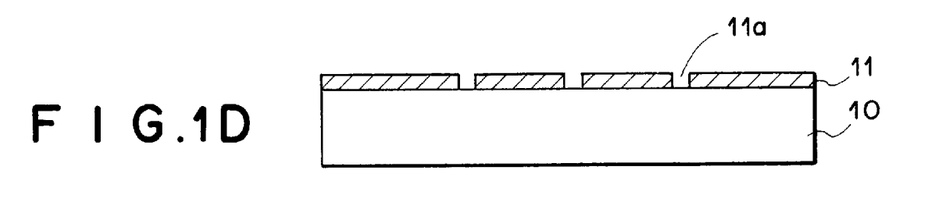
Figure 1E:
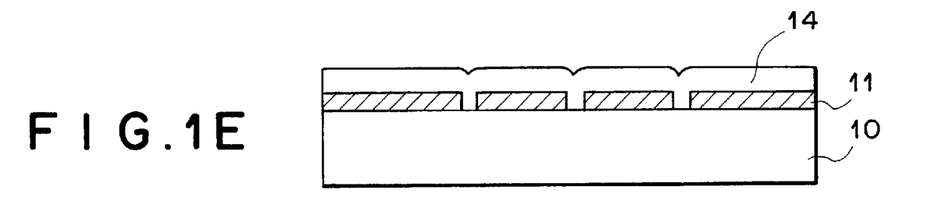

In the fifth stage, the shading film 11 in the construction of FIG. 1D is coated with spin-on-glass (SOG), and the SOG coating is baked so as to deposit $SiO_2$ 14, as illustrated in FIG. 1E.

Figure 1F:
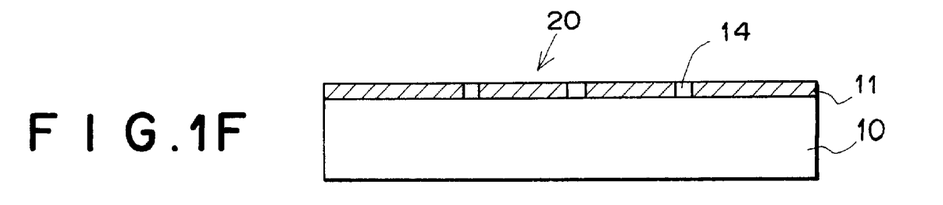

In the sixth stage, the $SiO_2$ layer 14 is etched back by dry etching using $CF_4$ until the $SiO_2$ deposit on the shading film 11 is removed, as illustrated in FIG. 1F. Thus, the process of producing the photomask 20 in the first embodiment of the present invention is completed.

Figure 2:
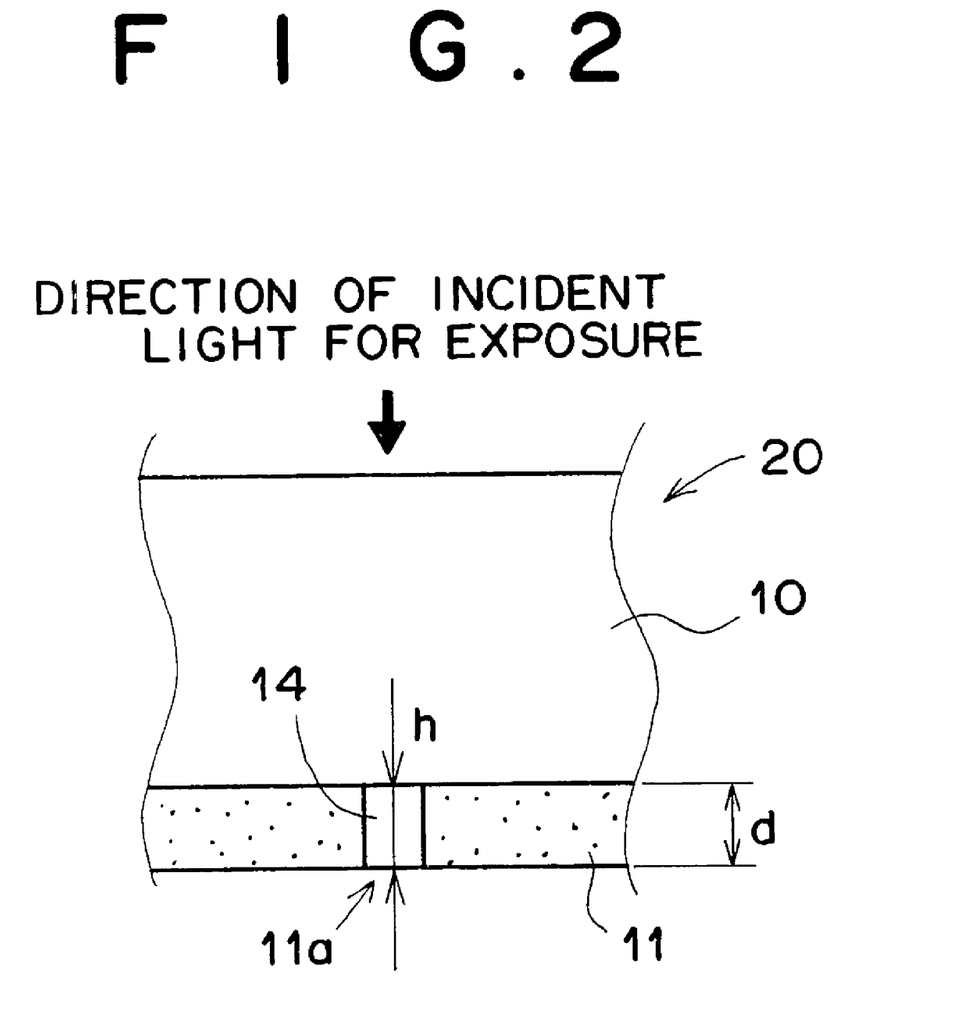
FIG. 2 is a magnified cross-sectional view of the photomask in the first embodiment of the present invention.

FIG. 2 is a magnified cross-sectional view of the photomask 20 in the first embodiment of the present invention. As illustrated in FIG. 2, the opening 11a of the shading film 11 is filled with $SiO_2$ 14 as a filler. In the photomask 20 as the first embodiment of the present invention, the height h of the $SiO_2$ filler 14 above the level of the boundary between the mask support 10 and the shading film 11 is identical with the thickness d of the shading film 11. That is, the top surface of the $SiO_2$ filler 14 is flush with the top surface of the shading film 11.

In the case where the photomask 20 as the first embodiment of the present invention is used for near-field exposure, near-field light emerges from the top surface of the $SiO_2$ filler 14. Therefore, when the photomask 20 is placed so that the shading film 11 is in contact with an object to be exposed, the near-field light can immediately enter the object, and thus the object can be exposed to the near-field light with a sufficient intensity.

In addition, since the top surface of the $SiO_2$ filler 14 is flush with the top surface of the shading film 11, the shading film 11 can tightly fit the object, and therefore the object can be effectively exposed to the near-field light.

Even in the case where the shading film 11 is not in contact with the object during the near-field exposure, the near-field light emerging from the top surface of the $SiO_2$ filler 14 can reach the object within the attenuation distance of 50 nm, as far as the distance between the shading film 11 and the object does not exceed 50 nm. Therefore, in this case, the object can also be exposed to the near-field light with a sufficient intensity.

Further, since the thickness of the shading film 11 is identical with the height of the $SiO_2$ filler 14 above the mask support 10, the thickness of the shading film 11 can be increased to the height of the $SiO_2$ filler 14 above the level of the mask support 10. That is, the thickness of the shading film 11 can be increased to a desired thickness by increasing the height of the $SiO_2$ filler 14 above the level of the mask support 10, with the thickness of the shading film 11. Therefore, it is possible to sufficiently increase the thickness of the shading film 11, so that the aforementioned fogging can be prevented, and the durability can be enhanced.

Although, in the process of FIGS. 1A to 1F, the planarization of the $SiO_2$ deposit 14 is realized by the etching back operation, the $SiO_2$ deposit 14 may be planarized by a polishing technique such as the conventional CMP (chemical mechanical polishing) technique. In addition, the $SiO_2$ filler 14 may be formed by a vacuum film formation technique such as CVD (chemical vapor deposition) and sputtering, instead of using the SOG.

Although the shading film 11 in the photomask 20 in the first embodiment of the present invention is made of chromium, the shading film 11 may be a multilayer film made of other metals, e.g., gold. Alternatively, the shading film 11 may be made of alloy or the like, instead of chromium. Further, as long as a sufficient extinction ratio is secured between the $SiO_2$ filler 14 and the shading film 11 with respect to the exposure light, the shading film 11 can be made of polymers, metal dispersed silica, or the like.

Although the mask support 10 in the photomask 20 in the first embodiment of the present invention is made of quartz glass, the mask support 10 may be made of other materials, e.g., polymers.

Second Embodiment

The process for producing a photomask for use in near-field exposure, as the second embodiment of the present invention, is explained below with reference to FIGS. 3A to 3F, which are cross-sectional views of the constructions in the initial, four intermediate, and final stages of the process. The same reference numerals as in FIGS. 1A to 1F are assigned to the elements in FIGS. 3A to 3F which are substantially the same as the corresponding elements in FIGS. 1A to 1F.

Figure 3A:
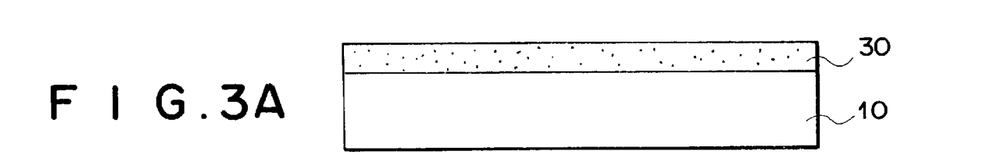
FIGS. 3A to 3F are cross-sectional views of the constructions in the initial, four intermediate, and final stages in the process of producing a photomask in the second embodiment of the present invention.

In the first stage, a surface of a mask support 10 undergoes HMDS (hexamethyle disilazane) treatment for enhancing adhesiveness. Then, the surface of the mask support 10 is coated with an electron beam resist 30 as illustrated in FIG. 3A, and the electron beam resist 30 is baked. Next, for the purpose of charge-up elimination, gold is deposited to a thickness of about 10 nm by vacuum evaporation.

Figure 3B:
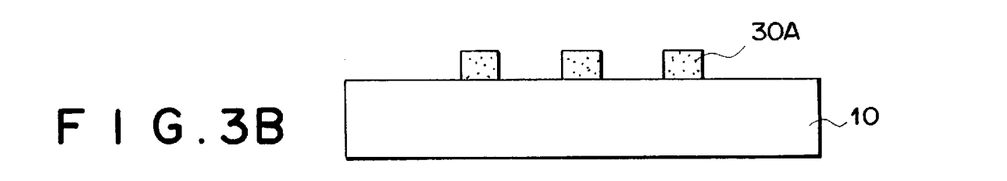

In the second stage, portions of the electron beam resist, corresponding to a predetermined pattern, are exposed to an electron beam, and post exposure baking (PEB) is performed. Then, the gold is removed by using an iodide etchant. Thereafter, a developing operation is performed on the electron beam resist 30 by using a special developer, so that a resist pattern 30A is formed as illustrated in FIG. 3B.

In the third stage, the mask support 10 is etched to a predetermined depth (e.g., 100 nm), as illustrated in FIG. 1C, by using the resist pattern 30A as a mask and buffered fluoric acid as an etchant.

In the fourth stage, the resist pattern 30A is removed by using a resist remover solution, as illustrated in FIG. 1D.

In the fifth stage, chromium is deposited to a predetermined thickness (e.g., 300 nm), which is greater than the above predetermined depth of etching, by electron beam evaporation, so as to form a chromium layer 31' as illustrated in FIG. 1E.

Figure 3C:
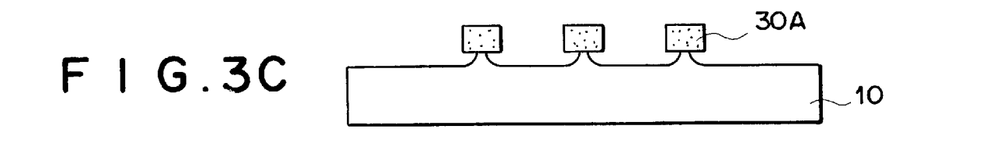
Figure 3D:
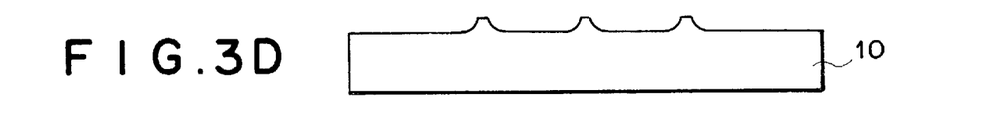
Figure 3E:
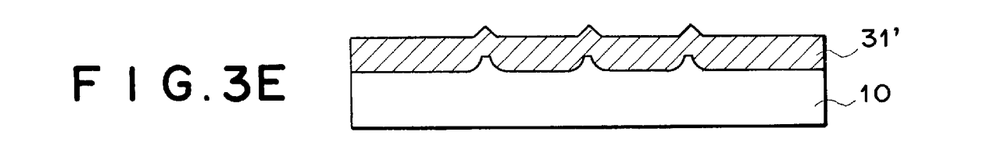
Figure 3F:
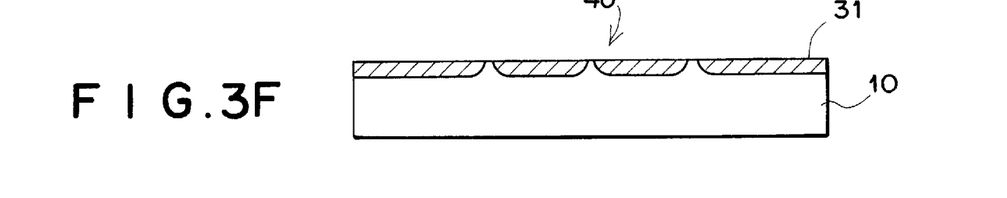

In the sixth stage, the chromium layer 31' is polished by the CMP (chemical mechanical polishing) technique until at least the top surface of the unetched portions of the mask support 10 is uncovered, so that the remaining portions 31 of the chromium layer 31' realizes the shading film, as illustrated in FIG. 3F. Thus, the process of producing the photomask 40 in the second embodiment of the present invention is completed.

Figure 4:
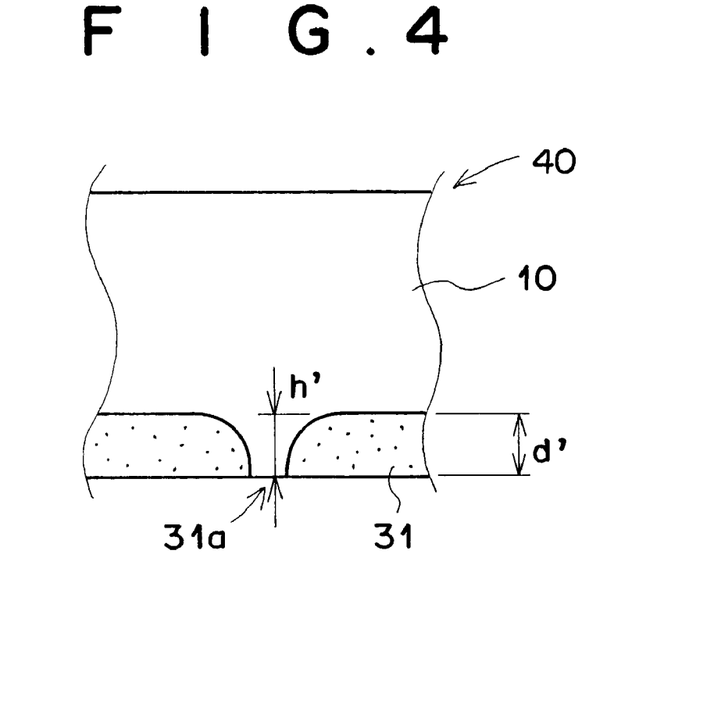
FIG. 4 is a magnified cross-sectional view of the photomask in the second embodiment of the present invention.

FIG. 4 is a magnified cross-sectional view of the photomask 40 as the second embodiment of the present invention. As illustrated in FIG. 4, in the photomask 40, each opening 31a of the shading film 31 is filled with a protruding portion of the mask support 10. In the photomask 40, the height h' of the protruding portion above the level of the boundary between the mask support 10 and the shading film 31 is identical with the thickness d' of the shading film 31. That is, the uncovered top surface of the protruding portion at the opening 31a is flush with the top surface of the shading film 31. Therefore, the photomask 40 has basically the same advantages as the first embodiment.

In addition, since the upper portions of the mask support 10 which are filled with the shading film 31 is formed by the isotropic wet etching, the width of the above protruding portion (i.e., the opening 31a) is gradually reduced with elevation above the level of the boundary between the mask support 10 and the shading film 31, as illustrated in FIG. 4. Therefore, the photomask 40 in the second embodiment of the present invention has the following advantages.

Due to the above shape of the protruding portion, the attenuation of the exposure light can be reduced. In addition, as illustrated in FIG. 3C, the width of the opening 31a of the shading film 31 (i.e., the width of the top of the protruding portion) is smaller than the width of the openings in the resist pattern 30A. Therefore, the openings in the resist pattern can be formed with a greater size than the desired size of the opening in the photomask. That is, the openings in the resist pattern can be formed easily. This is very advantageous when the desired size of the opening in the photomask is very small.

Although, in the process of FIGS. 3A to 3F, the isotropic wet etching is used for forming the upper portions of the mask support 10 which are filled with the shading film 31, instead, dry etching such as reactive ion etching may be used. In this case, the protruding portion can be formed in the same shape, and has the same advantages, as in the case of the wet etching.

Although, in the process of FIGS. 3A to 3F, the shading film 31' is formed by the evaporation, the shading film 31' may be formed by plating, CVD, application of liquid, or the like.

Third Embodiment

As explained above, in each of the first and second embodiments, the height of the filler or protruding portion above the level of the boundary between the mask support and the shading film is identical with the thickness of the shading film. However, in the third embodiment of the present invention, the height of the filler or protruding portion above the level of the covered portions of the mask support is different from the thickness of the shading film.

Figure 5:
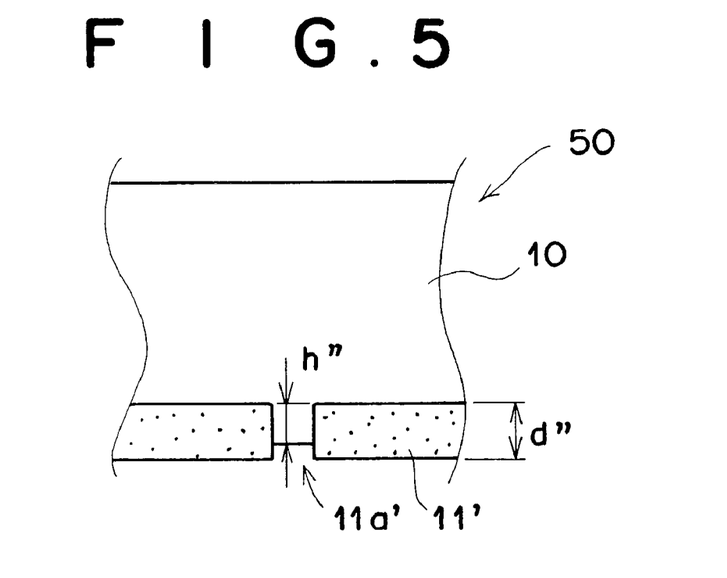
FIG. 5 is a magnified cross-sectional view of the photomask in the third embodiment of the present invention.

FIG. 5 is a magnified cross-sectional view of the photomask 50 as the third embodiment of the present invention. In the photomask 50 of FIG. 5, the height h" of the filler or protruding portion above the level of the covered portions of the mask support is smaller than the thickness d" of the shading film, i.e., h"<d", and the difference between the height h" and the thickness d" does not exceed 50 nm. For effecting the near-field exposure, the object may or may not be in contact with the photomask 50 of the third embodiment of the present invention, as long as the distance between the top of the filler or protruding portion and the object does not exceed 50 nm. In either case, the object can be exposed to nearfield light with a sufficient intensity. In addition, according to the third aspect of the present invention, the shading film 11' can be formed with a sufficient thickness.

Conversely, as a variation of the construction of FIG. 5, the height h" of the filler or protruding portion above the level of the covered portions of the mask support may be greater than the thickness d" of the shading film, i.e., h">d". In this case, the difference between the height h" and the thickness d" should also be equal to or less than 50 nm, so as to prevent spread of the near-field light and the resultant lowering of resolution of images generated by exposure of the near-field light. Similarly, the object may or may not be in contact with such a photomask, as long as the distance between the top of the filler or protruding portion and the object does not exceed 50 nm. In either case, the object can be exposed to near-field light with a sufficient intensity, and the shading film 11' can be formed with a sufficient thickness.

Fourth Embodiment

The process for producing a photomask for use in near-field exposure, as the fourth embodiment of the present invention, is explained below with reference to FIGS. 6A to 6E and 7A to 7E. FIGS. 6A to 6E are cross-sectional views illustrating a process of producing a mold which is used for producing the photomask in the fourth embodiment of the present invention, and FIGS. 7A to 7E are cross-sectional views illustrating a process of producing the photomask in the fourth embodiment of the present invention. In the following explanations, it is assumed that the photomasks in the fourth embodiment of the present invention are produced for manufacturing a grating pattern.

First, the process of producing the mold is explained below with reference to FIGS. 6A to 6E.

Figure 6A:
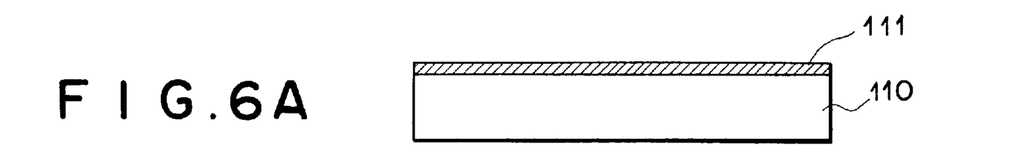
FIGS. 6A to 6E are cross-sectional views illustrating a process of producing a mold which is used for producing a photomask in the fourth embodiment of the present invention.

In the first stage of the process of producing the mold, as illustrated in FIG. 6A, a $SiO_2$ film 111 having a thickness of 50 nm is formed by thermal oxidation on a silicon wafer 110, which is cut along a face (100).

Figure 6B:
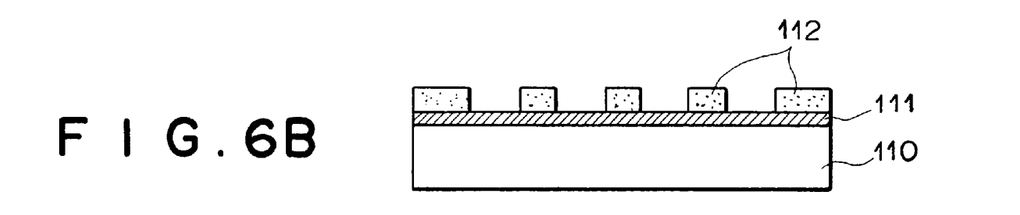

In the second stage of the process of producing the mold, the surface of the silicon wafer 110 is coated with an electron beam resist, and the electron beam resist is baked. Next, portions of the electron beam resist, corresponding to a predetermined pattern, are exposed to an electron beam, and post exposure baking (PEB) is performed. Then, a developing operation is performed on the electron beam resist by using a special developer, so that a resist pattern 112 is formed as illustrated in FIG. 6B. The resist pattern 112 includes a plurality of stripe portions extending in the direction perpendicular to the illustrated cross-section, and being arranged at predetermined intervals, where the direction of the plurality of stripe portions are in parallel with the face (111) of the silicon wafer 110.

Figure 6C:
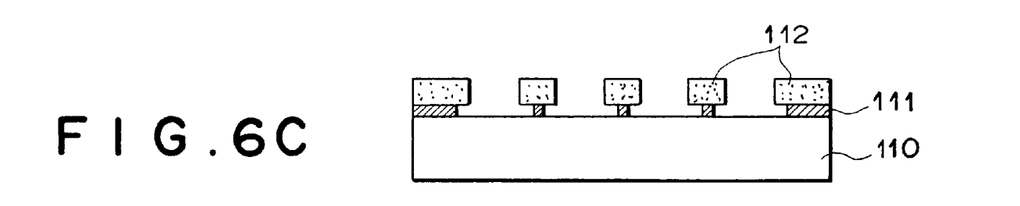

In the third stage of the process of producing the mold, the $SiO_2$ film 111 is etched as illustrated in FIG. 6C, by using the resist pattern 112 as a mask, and buffered fluoric acid as an etchant.

Figure 6D:
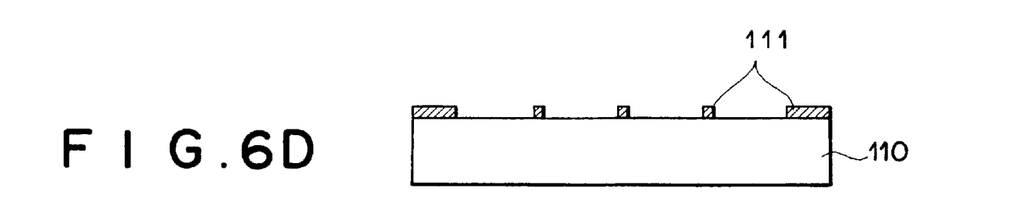

In the fourth stage of the process of producing the mold, the resist pattern 112 is removed by using a resist remover solution, as illustrated in FIG. 6D, and then the resist remover solution is rinsed off.

Figure 6E:
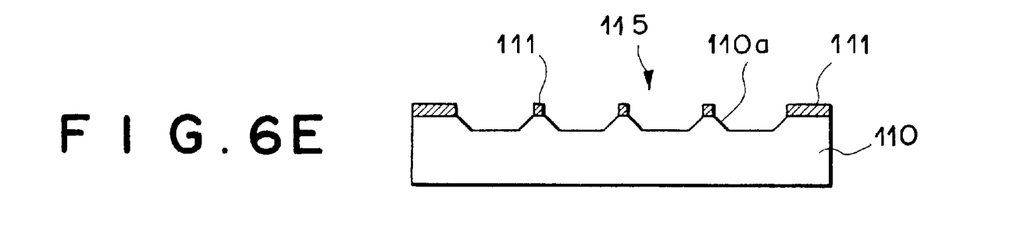

In the fifth stage of the process of producing the mold, the silicon wafer 110 is further etched by using the remaining portions of the $SiO_2$ film 111 as a mask and an ethylene diamine pyrocatechol etchant as an anisotropic etchant so as to form trenches 110a having inclined surfaces which expose the face (111), as illustrated in FIG. 6E. Thus, the process of producing the mold 115 which has convex and concave portions is completed.

The process of producing the photomask by using the above mold 115 in the fourth embodiment of the present invention is explained below with reference to FIGS. 7A to 7E.

Figure 7A:
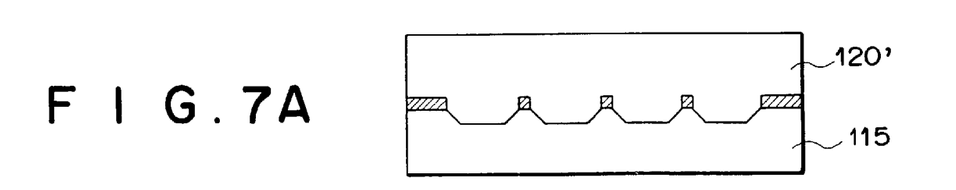
FIGS. 7A to 7E are cross-sectional views illustrating a process of producing the photomask in the fourth embodiment of the present invention.

In the first stage of the process of producing the photomask, an acrylic resin 120' is poured into the mold 115, and is then cured, as illustrated in FIG. 7A.

Figure 7B:
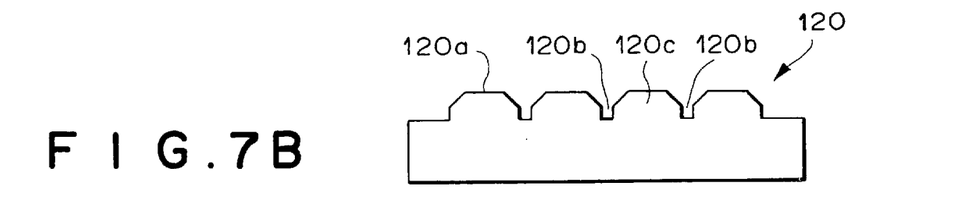

In the second stage of the process of producing the photomask, the cured acrylic resin 120' is pulled out from the mold 115 to obtain the mask support 120 as illustrated in FIG. 7B. The mask support 120 has a plurality of trenches 120b and a plurality of convex portions 120c arranged between the plurality of trenches 120b. The plurality of trenches 120b and the plurality of convex portions 120c are formed corresponding to the concave and convex portions in the mold 115.

Figure 7C:
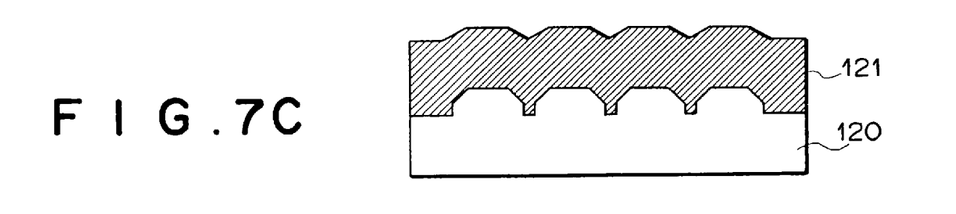

In the third stage of the process of producing the photomask, a chromium film 121 having a thickness of 300 nm is formed on the mask support 120 by electron beam evaporation, so that the trenches 120b are filled with chromium, as illustrated in FIG. 7C.

Figure 7D:
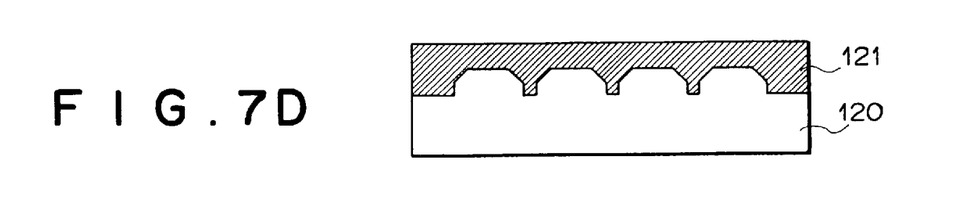

In the fourth stage of the process of producing the photomask, the chromium film 121 is planarized by the CMP (chemical mechanical polishing) technique, as illustrated in FIG. 7D.

Figure 7E:
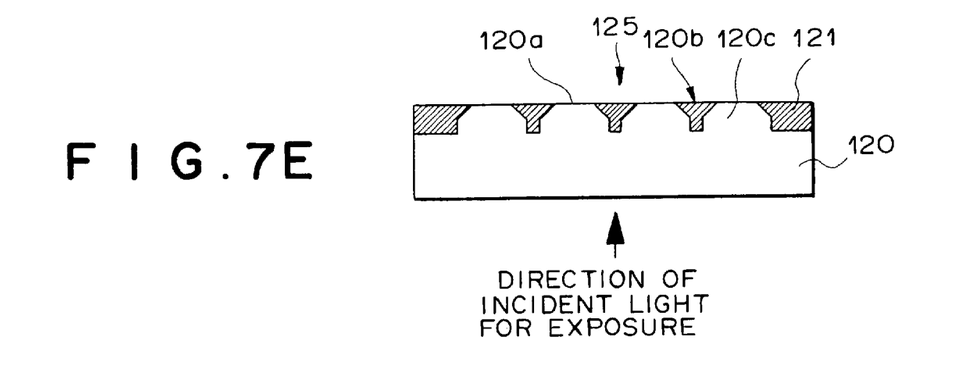

In the fifth stage of the process of producing the photomask, the chromium film 121 is etched with a cerium ammonium nitrate etchant until the top surfaces of the plurality of convex portions 120c of the mask support 120 are uncovered, as illustrated in FIG. 7E. Thus, the process of producing the photomask 125 in the fourth embodiment of the present invention is completed. The mask support 120 has on one side thereof the plurality of trenches 120b and the plurality of convex portions 120c. A plurality of portions of the chromium film 121 as a shading film are embedded in the plurality of trenches 120b, and the plurality of convex portions 120c realize the openings for transmitting near-field light. The top surfaces of the plurality of convex portions 120c of the mask support 120 are flush with the top surfaces of the chromium film 121.

In the case where the photomask 125 in the fourth embodiment of the present invention is used for near-field exposure, near-field light emerges from the plurality of convex portions 120c. Therefore, when the photomask 125 is placed so that the shading film 121 is in contact with an object to be exposed, the near-field light emerging from the plurality of convex portions 120c can immediately enter the object, and thus the object can be exposed to the near-field light with a sufficient intensity.

Even in the case where the shading film 121 is not in contact with the object during the near-field exposure, the near-field light emerging from the top surfaces of the plurality of convex portions 120c can reach the object within the attenuation distance of 50 nm, as long as the distance between the shading film 121 and the object does not exceed 50 nm. Therefore, in this case, the object can also be exposed to the near-field light with a sufficient intensity.

In addition, the thickness of the chromium film 121 as the shading film can be increased by increasing the depth of the trenches 120c in the mask support 120. Therefore, it is possible to sufficiently increase the thickness of the shading film 121, so that the fogging can be prevented, and the durability can be enhanced.

Further, since the width of each of the plurality of convex portions 120c is gradually reduced with elevation above the level of the bottom of the shading film 121, as illustrated in FIG. 7E, the attenuation of the exposure light can be reduced.

Although, in the photomask 125 in the fourth embodiment of the present invention, the top surfaces of the plurality of convex portions 120c of the mask support 120 are flush with the top surfaces of the chromium film 121, the heights of the top surfaces of plurality of convex portions 120c may be different from the height of the top surface of the shading film 121. In this case, the object can also be exposed to the near-field light with a sufficient intensity, as long as the distance between the shading film 121 and the object does not exceed 50 nm.

Fifth Embodiment

The process for producing a photomask for use in near-field exposure, as the fifth embodiment of the present invention, is explained below with reference to FIGS. 8A to 8E and 9A to 9F. FIGS. 8A to 8E are cross-sectional views illustrating a process of producing a mold which is used for producing the photomask in the fifth embodiment of the present invention, and FIGS. 9A to 9F are cross-sectional views illustrating a process of producing the photomask in the fifth embodiment of the present invention. In the following explanations, it is assumed that the photomask in the fifth embodiment of the present invention is produced for manufacturing a grating pattern.

First, the process of producing the mold is explained below with reference to FIGS. 8A to 8E.

Figure 8A:
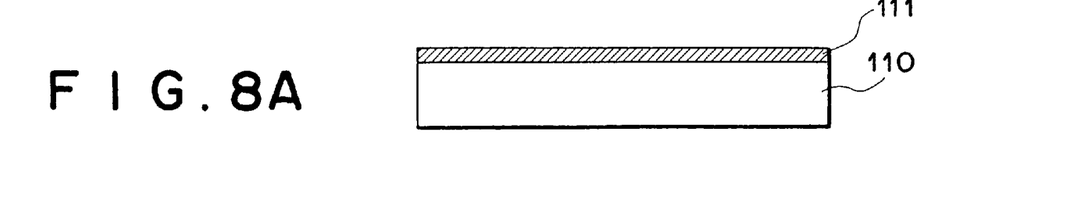
FIGS. 8A to 8E are cross-sectional views illustrating a process of producing a mold which is used for producing a photomask in the fifth embodiment of the present invention.

In the first stage of the process of producing the mold, as illustrated in FIG. 8A, a $SiO_2$ film 111 having a thickness of 50 nm is formed by thermal oxidation on a silicon wafer 110, which is cut along a (100) face.

Figure 8B:
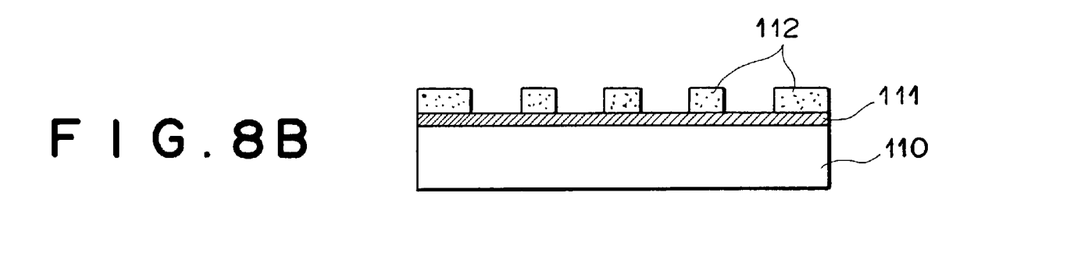

In the second stage of the process of producing the mold, the surface of the silicon wafer 110 is coated with an electron beam resist, and the electron beam resist is baked. Next, portions of the electron beam resist, corresponding to a predetermined pattern, are exposed to an electron beam, and post exposure baking (PEB) is performed. Then, the electron beam resist undergoes developing processing using a special developer, so that a resist pattern 112 is formed as illustrated in FIG. 8B. The resist pattern 112 includes a plurality of stripe portions extending in the direction perpendicular to the illustrated crosssection, and being arranged at predetermined intervals, where the direction of the plurality of stripe portions are in parallel with the (111) face of the silicon wafer 110.

Figure 8C:
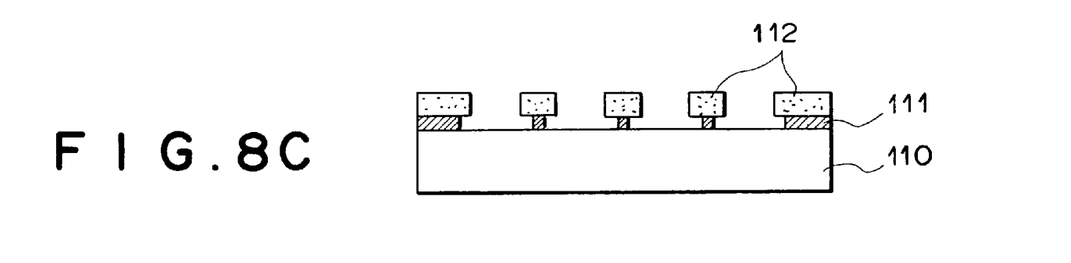

In the third stage of the process of producing the mold, dry etching is performed on the $SiO_2$ film 111 as illustrated in FIG. 8C, by using the resist pattern 112 as a mask and $CF_4$ as an etching gas.

Figure 8D:
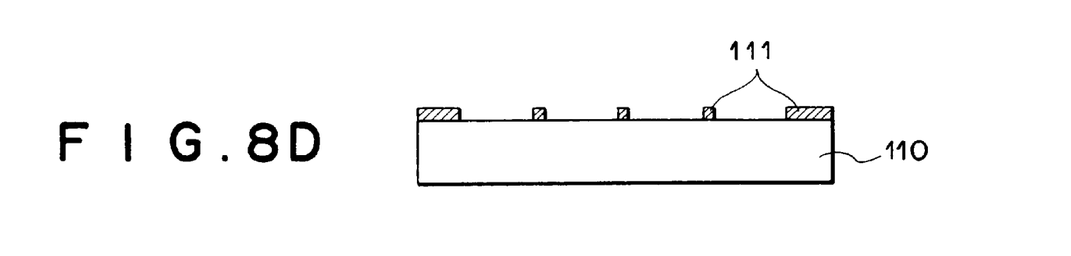

In the fourth stage of the process of producing the mold, the resist pattern 112 is removed by using a resist remover solution, as illustrated in FIG. 8D, and then the resist remover solution is rinsed off.

Figure 8E:
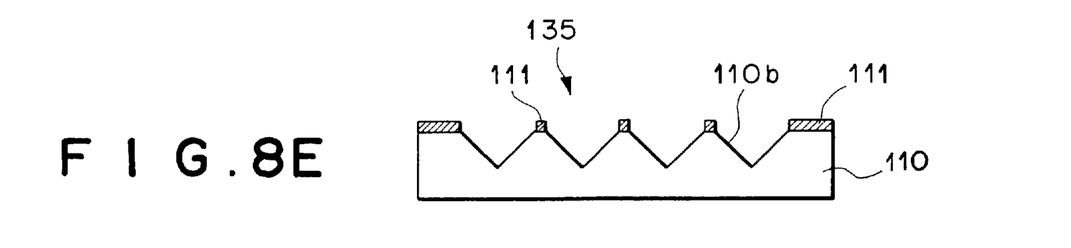

In the fifth stage of the process of producing the mold, the silicon wafer 110 is further etched by using the remaining portions of the $SiO_2$ film 111 as a mask and an ethylene diamine pyrocatechol etchant as an anisotropic etchant so as to form a V-groove 10b, as illustrated in FIG. 8E. Thus, the process of producing the mold 135 which has convex and concave portions is completed.

The process of producing the photomask by using the above mold 135 in the fifth embodiment of the present invention is explained below with reference to FIGS. 9A to 9F.

Figure 9A:
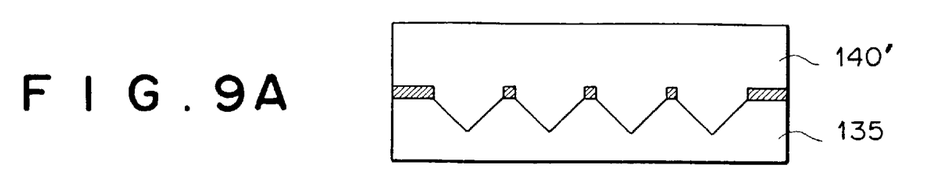
FIGS. 9A to 9F are cross-sectional views illustrating a process of producing the photomask in the fifth embodiment of the present invention.

In the first stage of the process of producing the photomask, an acrylic resin 140' is poured into the mold 135, and is then cured, as illustrated in FIG. 9A.

Figure 9B:
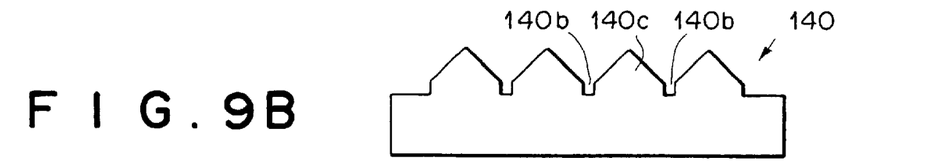

In the second stage of the process of producing the photomask, the cured acrylic resin 140' is pulled out from the mold 135 to obtain the mask support 140 as illustrated in FIG. 9B. The mask support 140 has a plurality of trenches 140b and a plurality of convex portions 140c arranged between the plurality of trenches 140b. The plurality of trenches 140b and the plurality of convex portions 140c are formed corresponding to the convex and concave portions in the mold 135.

Figure 9C:
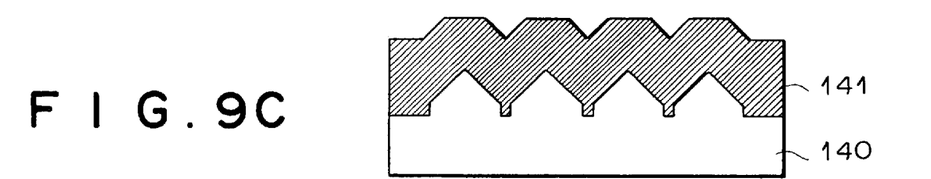

In the third stage of the process of producing the photomask, a chromium film 141 having a thickness of 300 nm is formed on the mask support 140 by electron beam evaporation, so that the trenches 140b are filled with chromium, as illustrated in FIG. 9C.

Figure 9D:
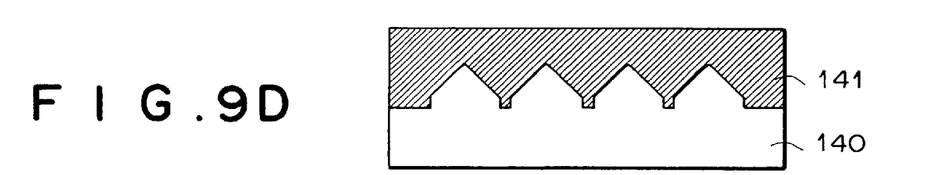

In the fourth stage of the process of producing the photomask, the chromium film 141 is planarized by the CMP (chemical mechanical polishing) technique, as illustrated in FIG. 9D.

Figure 9E:
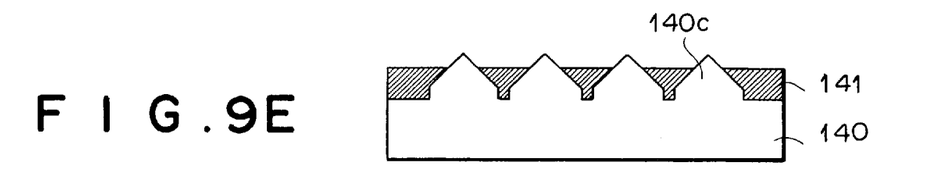

In the fifth stage of the process of producing the photomask, the chromium film 141 is etched with a cerium ammonium nitrate etchant until the roof-shaped portions of the plurality of convex portions 140c of the mask support 140 are uncovered, as illustrated in FIG. 9E.

Figure 9F:
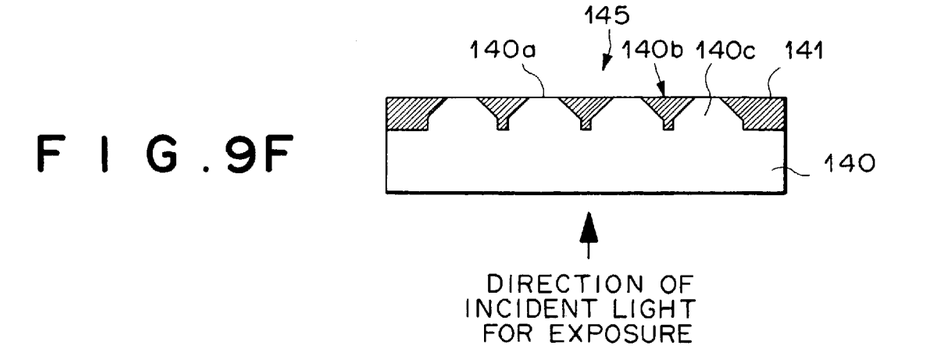

In the sixth stage of the process of producing the photomask, the protrusions of the plurality of convex portions 140c from the surface of the shading film 141 are removed by $O_2$ ashing, as illustrated in FIG. 9F. Thus, the process of producing the photomask 145 in the fifth embodiment of the present invention is completed.

The mask support 140 of the photomask 145 has on one side thereof the plurality of trenches 140b and the plurality of convex portions 140c. A plurality of portions of the chromium film 141 as a shading film are embedded in the plurality of trenches 140b, and the plurality of convex portions 140c realize the openings for transmitting near-field light. The top surfaces of the processed convex portions 140c of the mask support 140 are flush with the top surfaces of the chromium film 141.

The photomask 145 in the fifth embodiment of the present invention has the same advantages as the fourth embodiment, and has the following additional advantages.

Since the mold 135 has the V-grooves 110b, the widths of the V-grooves 110b gradually increase with elevation above the bottom. Therefore, the mask support 140 produced by using the mold 135 has a plurality of roof-shaped (convex) portions as illustrated in FIG. 9B. Thus, it is possible to produce a flat top surface with an arbitrary width in each of the convex portions 140c by appropriately controlling the amount (depth) of chromium removed from the chromium film 141 by CMP in the above fourth stage of the process of producing the photomask. The widths of the top surfaces of the convex portions 140c are the widths of the openings of the photomask. Therefore, when the grating pattern is formed by using such a photomask, the line-and-space ratio of the grating pattern can be accurately adjusted by appropriately controlling the amount (depth) of chromium removed from the chromium film 141. Namely, even when the mold is produced with a relatively large margin, a desired line-and-space ratio of the grating pattern can be obtained by appropriately controlling the amount (depth) of chromium removed from the chromium film 141. When large margins are allowed for the dimensions of the projections and depressions in the mold 135, the mold can be manufactured in a short time at low cost, and therefore the photomask 145 produced by using the mold 135 can also be manufactured in a short time at low cost.

Further, since the widths of the openings (i.e., widths of the top surfaces of the convex portions 140c) of the photomask are determined by the amount (depth) of chromium removed from the chromium film 141 by the CMP as described above, the widths of the openings are smaller than the full widths of the V-grooves 110b. Therefore, when the process of FIGS. 8A to 8E and 9A to 9F is used, it is possible to produce a photomask which has openings with very small widths, so that precise near-field exposure is realized.

In addition, all of the contents of the Japanese Patent Application Nos. 11(1999)-175630, 11(1999)-272045 and 11(1999)-175631 are incorporated into this specification by reference.

What is claimed is:

1. A photomask for use in near-field exposure, comprising:
   a mask support which is transparent to exposure light;
   a shading film which is formed on one side of said mask support, and has at least one opening arranged to form a predetermined pattern; and
   at least one filler which is transparent to said exposure light, and is arranged in said at least one opening with a predetermined height above a level of a boundary between said mask support and said shading film.

2. A photomask according to claim 1, wherein a difference between a thickness of said shading film and said height of each of said at least one filler does not exceed 50 nanometers.

3. A photomask according to claim 2, wherein each of said at least one filler has a shape which is gradually narrowed toward a top of the filler.

4. A photomask according to claim 2, wherein each of said at least one filler is made of a different material from said mask support, and is coupled to the mask support.

5. A photomask according to claim 1, wherein each of said at least one filler has a shape which is gradually narrowed toward a top of the filler.

6. A photomask according to claim 5, wherein each of said at least one filler is made of a different material from said mask support, and is coupled to the mask support.

7. A photomask according to claim 1, wherein each of said at least one filler is made of a different material from said mask support, and is coupled to the mask support.

8. A process for producing a photomask for use in near-field exposure, comprising the steps of:
   (a) forming, on one side of a flat mask support which is transparent to exposure light, a shading film having at least one opening arranged to form a predetermined pattern; and
   (b) forming at least one filler which is transparent to said exposure light, in said at least one opening with a predetermined height above a level of a boundary between said mask support and said shading film.

9. A process according to claim 8, wherein said at least one filler is formed by embedding, in said at least one opening, a different material from said mask support.

10. A process according to claim 8, further comprising the step of,
    (c) planarizing one side of said mask support, after said shading film and said filler are formed on the mask support in said steps (a) and (b), by a polishing operation, so that a difference between a thickness of said shading film and said height of each of said at least one filler does not exceed 50 nanometers.

11. A process according to claim 8, further comprising the step of,
    (c) planarizing one side of said mask support, after said shading film and said filler are formed on the mask support in said steps (a) and (b), by an etching-back operation, so that a difference between a thickness of said shading film and said height of each of said at least one filler does not exceed 50 nanometers.

12. A photomask for use in near-field exposure, comprising:
    a mask support which is transparent to exposure light; and
    a shading film which is formed on one side of said mask support, and has at least one opening arranged to form a predetermined pattern;
    said mask support comprises at least one protrusion so as to fill said at least one opening, and has a predetermined height above a level of a bottom of said shading film.

13. A photomask according to claim 12, wherein a difference between a thickness of said shading film and said height of each of said at least one protrusion does not exceed 50 nanometers.

14. A photomask according to claim 13, wherein each of said at least one protrusion has a shape which is gradually narrowed toward a top of the protrusion.

15. A photomask according to claim 12, wherein each of said at least one protrusion has a shape which is gradually narrowed toward a top of the protrusion.

16. A process for producing a photomask for use in near-field exposure, comprising the steps of:
    (a) etching a surface, other than at least one portion corresponding to at least one opening of a shading film, of a flat mask support which is transparent to exposure light, to a predetermined depth, so as to form at least one concave portion, and leave at least one protrusion corresponding to said at least one opening, where said at least one protrusion has at least a predetermined height above a level of a bottom of said at least one concave portion; and
    (b) forming said shading film in said at least one concave portion.

17. A process according to claim 16, further comprising the step of,
    (c) planarizing one side of said mask support, after said shading film is formed on the mask support in said step (b), by a polishing operation, so that a difference between a thickness of said shading film and said height of each of said at least one protrusion does not exceed 50 nanometers.

18. A process according to claim 16, further comprising the step of,
    (c) planarizing one side of said mask support, after said shading film is formed on the mask support in said step (b), by an etching-back operation, so that a difference between a thickness of said shading film and said height of each of said at least one protrusion does not exceed 50 nanometers.

19. A photomask for use in near-field exposure, comprising:
    a mask support which is transparent to exposure light, and has a plurality of concave portions on one side of the mask support so as to form at least one convex portion between said plurality of concave portions; and
    a shading film which is embedded in said plurality of concave portions, and has at least one opening arranged to form a predetermined pattern, where said at least one convex portion corresponds to said at least one opening;
    wherein a difference between heights of top surfaces of said at least one convex portion and said shading film does not exceed 50 nanometers.

20. A photomask according to claim 19, wherein each of said at least one convex portion has a shape which is gradually narrowed toward said top surface of the convex portion.

21. A process for producing a photomask for use in near-field exposure, comprising the steps of:
    (a) producing a mold having a plurality of first convex portions and at least one first concave portion, where said plurality of first convex portions are provided for forming a plurality of second concave portions on one side of a mask support, and said at least one first concave portion is provided for forming at least one second convex portion on said one side of said mask support;

(b) forming said mask support by using said mold, where said mask support is transparent to exposure light, and has said plurality of second concave portions on said one side of the mask support and said at least one second convex portion between said plurality of second concave portions;

(c) depositing a shading material on an entire area of said mask support so as to fill said plurality of second concave portions with said shading material, and form a layer of said shading material; and (d) removing a portion of said layer of the shading material by performing a planarizing operation on the layer of the shading material so as to expose at least a top surface of said at least one second convex portion, and form a shading film with a remaining portion of the layer of the shading material.

22. A process according to claim 21, wherein in said step (a), said mold is made of silicon, and formed by anisotropic etching.

23. A process according to claim 21, wherein in said step (a), said at least one first concave portion has a shape which is narrowed toward a top of each of the at least one first concave portion.

24. A process according to claim 21, wherein in said step (d), said planarizing operation is realized by a polishing operation.

25. A process according to claim 21, wherein in said step (d), said planarizing operation is realized by an etching-back operation.

* * * * *